(12) United States Patent
Yang

(10) Patent No.: US 10,790,370 B2
(45) Date of Patent: Sep. 29, 2020

(54) WRAP AROUND CONTACT

(71) Applicant: Taiwan Semiconductor Manufacturing Co., Ltd., Hsin-chu (TW)

(72) Inventor: Chan Syun David Yang, Shinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/402,527

(22) Filed: May 3, 2019

(65) Prior Publication Data

US 2019/0259846 A1 Aug. 22, 2019

Related U.S. Application Data

(60) Continuation of application No. 15/933,812, filed on Mar. 23, 2018, now Pat. No. 10,283,603, which is a
(Continued)

(51) Int. Cl.
*H01L 29/417* (2006.01)
*H01L 29/78* (2006.01)
(Continued)

(52) U.S. Cl.
CPC ...... *H01L 29/41791* (2013.01); *H01L 21/263* (2013.01); *H01L 21/26533* (2013.01);
(Continued)

(58) Field of Classification Search
CPC ............ H01L 29/785; H01L 29/66795; H01L 2029/7858; H01L 21/823431
See application file for complete search history.

(56) References Cited

U.S. PATENT DOCUMENTS

2007/0249174 A1  10/2007  Yang
2009/0008705 A1*  1/2009  Zhu .................. H01L 29/66795
                                                    257/327
(Continued)

OTHER PUBLICATIONS

Overlay. (n.d.) Collins English Dictionary—Complete and Unabridged. (1991, 1994, 1998, 2000, 2003). Retrieved Sep. 16, 2015 from http://www.thefreedictionary.com/overlay.
(Continued)

*Primary Examiner* — Jay C Chang
*Assistant Examiner* — Mikka Liu
(74) *Attorney, Agent, or Firm* — Eschweiler & Potashnik, LLC

(57) ABSTRACT

In some embodiments, a semiconductor device is provided. The semiconductor device includes a first semiconductor fin that extends from a substrate. The first semiconductor fin has source and drain regions, which are separated from one another by a channel region in the first semiconductor fin. A gate overlies an upper surface and sidewalls of the channel region. A contact is coupled to the source or drain region of the first semiconductor fin, where the source or drain region includes a layer of epitaxial material with a substantially diamond-shaped cross-section. The contact surrounds the source or drain region on top and bottom surfaces of the substantially diamond-shaped cross-section. A first capping material is arranged along outer sidewalls of the first semiconductor fin under the contact. The first capping material has an uppermost surface that is spaced below a lowermost surface of the contact by a non-zero distance.

20 Claims, 10 Drawing Sheets

Related U.S. Application Data continuation of application No. 15/231,967, filed on Aug. 9, 2016, now Pat. No. 9,935,172, which is a division of application No. 14/196,320, filed on Mar. 4, 2014, now Pat. No. 9,425,310.

(51) Int. Cl.

| | | |
|---|---|---|
| *H01L 29/66* | (2006.01) | |
| *H01L 21/263* | (2006.01) | |
| *H01L 21/265* | (2006.01) | |
| *H01L 21/311* | (2006.01) | |
| *H01L 29/08* | (2006.01) | |
| *H01L 29/40* | (2006.01) | |
| *H01L 29/45* | (2006.01) | |
| *H01L 27/088* | (2006.01) | |
| *H01L 21/8234* | (2006.01) | |
| *H01L 29/165* | (2006.01) | |

(52) U.S. Cl.
CPC .... *H01L 21/31116* (2013.01); *H01L 29/0847* (2013.01); *H01L 29/401* (2013.01); *H01L 29/45* (2013.01); *H01L 29/66795* (2013.01); *H01L 29/785* (2013.01); *H01L 29/7848* (2013.01); *H01L 29/7851* (2013.01); *H01L 21/26506* (2013.01); *H01L 21/823431* (2013.01); *H01L 27/0886* (2013.01); *H01L 29/165* (2013.01); *H01L 2029/7858* (2013.01)

(56) References Cited

U.S. PATENT DOCUMENTS

| | | |
|---|---|---|
| 2009/0026505 A1 | 1/2009 | Okano |
| 2011/0193175 A1* | 8/2011 | Huang ............ H01L 21/823431 |
| | | 257/386 |
| 2013/0214357 A1 | 8/2013 | Chang et al. |
| 2014/0001520 A1 | 1/2014 | Glass et al. |
| 2014/0217517 A1* | 8/2014 | Cai .................... H01L 27/0886 |
| | | 257/401 |
| 2014/0273365 A1 | 9/2014 | Wei et al. |
| 2015/0035023 A1 | 2/2015 | Kim et al. |

OTHER PUBLICATIONS

Abut. (n.d.) American Heritage® Dictionary of the English Language, Fifth Edition. (2011). Retrieved Sep. 17, 2015 from http://www.thefreedictionary.com/abut.
Non-Final Office Action dated Sep. 25, 2015 for U.S. Appl. No. 14/196,320.
Notice of Allowance dated Apr. 22, 2016 for U.S. Appl. No. 14/196,320.
Non-Final Office Action dated Jul. 27, 2017 for U.S. Appl. No. 15/231,967.
Notice of Allowance dated Nov. 22, 2017 for U.S. Appl. No. 15/231,967.
Non-Final Office Action dated Jul. 2, 2018 for U.S. Appl. No. 15/933,812.
Notice of Allowance dated Feb. 13, 2019 for U.S. Appl. No. 15/933,812.

\* cited by examiner

WRAP AROUND CONTACT

REFERENCE TO RELATED APPLICATIONS

This Application is a Continuation of U.S. application Ser. No. 15/933,812, filed on Mar. 23, 2018, which is a Continuation of U.S. application Ser. No. 15/231,967, filed on Aug. 9, 2016 (now U.S. Pat. No. 9,935,172, issued on Apr. 3, 2018), which is a Divisional of U.S. application Ser. No. 14/196,320, filed on Mar. 4, 2014 (now U.S. Pat. No. 9,425,310, issued on Aug. 23, 2016). The contents of the above-referenced Patent Applications are hereby incorporated by reference in their entirety.

BACKGROUND

The following disclosure relates to semiconductor manufacturing methods. In particular, the following disclosure relates to a contact formed to a semiconductor device and a method of forming the contact.

Nonplanar semiconducting devices such as "finned" field-effect transistors (FinFETs) formed on a silicon substrate include a silicon fin that forms the source and drain regions of the finFET. The source and drain regions are separated by a channel region, and a gate "wraps" around the upper surface and sidewalls of the channel region. The finned structure of the channel region increases the effective gate width of the FinFET over a planar FET, which allows for increased gate control of the channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
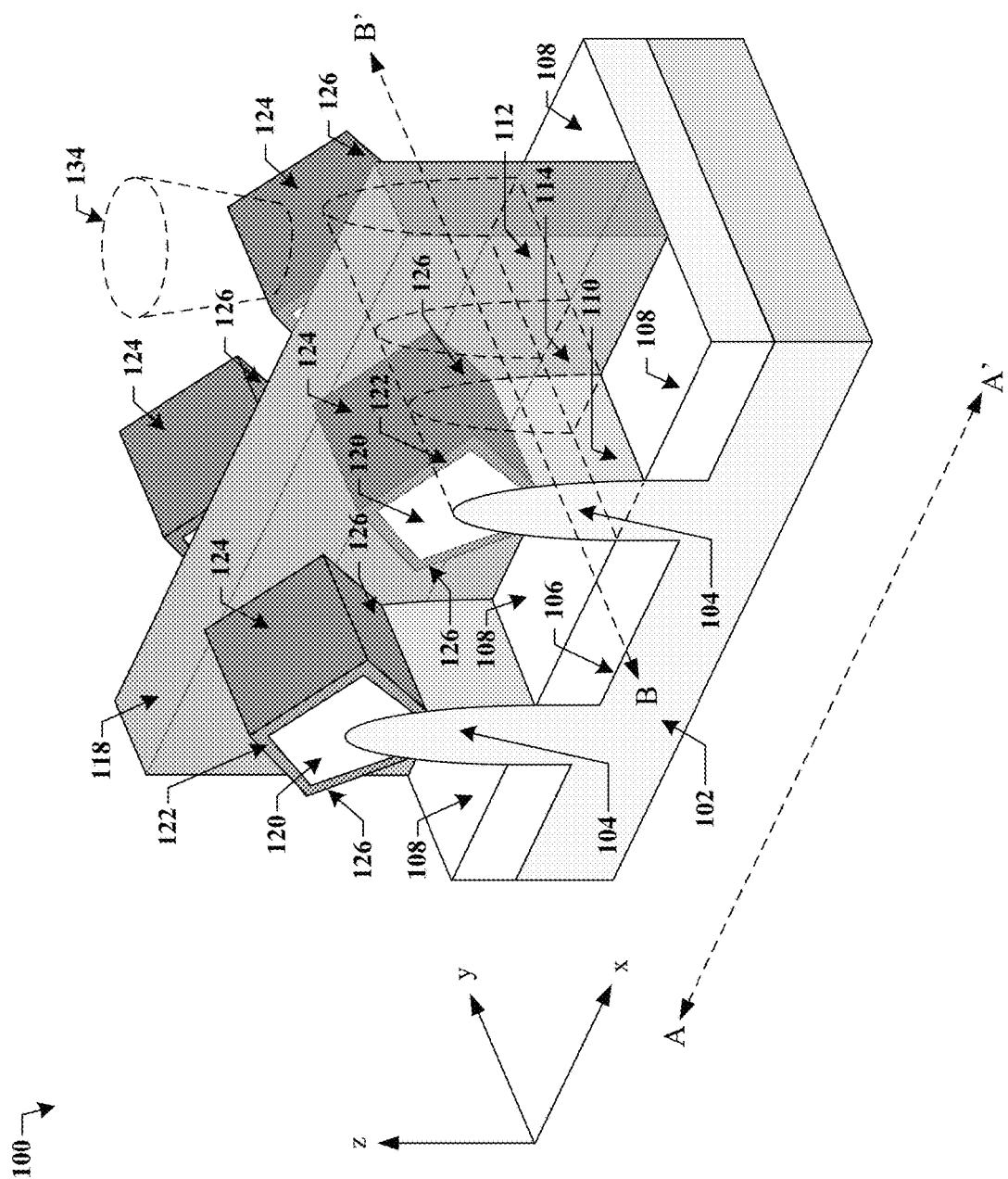
FIGS. 1A-1C illustrate some embodiments of a "finned" field-effect transistor (FinFET) with a wrap-around source or drain contact.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over," "on," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Wrap-around contact formation to the source or drain of a "finned" field-effect transistor (FinFET) allows for increased contact area to lower contact resistance and increase performance of the FinFET over a planar FET. Some FinFETs utilize a layer of epitaxial material to produce strain within the channel region to increase carrier mobility and hence further increase FinFET performance. The epitaxial material has a diamond-shaped cross-section with top and bottom surfaces that are covered with a capping layer, which must be removed prior to contact formation.

Some conventional methods of capping layer removal around the diamond-shaped epitaxial material comprise a dry etch to remove the capping layer material from the top surfaces of the diamond-shape to expose the epitaxial material on the top surfaces. However, the bottom surfaces are not exposed to the dry etchant. As a result, the dry etch does not remove the capping layer material on bottom surfaces. Removal of the capping layer material from bottom the surfaces can increase contact area for the wrap-around contact. Therefore, some conventional methods also use a wet etch to remove the capping layer material from bottom the surfaces.

In some instances, the dry etch includes an $O_2$ plasma that causes oxidation of the epitaxial material. The oxidized epitaxial material reacts with the wet etchant during the wet etch step, which results in significant loss of the epitaxial material from the source or drain region, and reduces strain within the channel region and consequently decreases carrier mobility. Loss of the epitaxial material also decreases contact area of the wrap-around contact. These effects can degrade FinFET performance.

Accordingly, some embodiments of the present disclosure relate to a wrap-around contact formed to a source or drain region of a FinFET. An epitaxial material is formed over the source or drain region, which includes a diamond-shaped cross-section with top and bottom surfaces. A capping layer is formed over the top and bottom surfaces. The source or drain region is then subjected to a first etch to remove the capping layer surrounding the top surfaces of the diamond-shaped cross-section. A protective layer is formed within the top surfaces. A second etch of the capping layer is performed to remove the capping layer surrounding the bottom surfaces of the diamond-shaped cross-section, while using the protective layer to prevent etching of the top surfaces by the second etch. A wrap-around contact is formed to the source or drain region, which surrounds the source or drain region on the top and bottom surfaces of the diamond-shaped cross-section.

The FinFET and methods of wrap-around contact formation disclosed herein prevent the loss of epitaxial material from the source or drain regions that are observed in some conventional methods. The resultant wrap-around contact does not experience the loss of channel region strain or reduced contact area due to epitaxial material loss. The wrap-around contact also contacts the top and bottom surfaces of the epitaxial material, which increases the contact area over some conventional methods where the capping layer on the bottom surfaces is not fully removed.

FIG. 1A illustrates some embodiments of a FinFET 100. The FinFET 100 is formed on a semiconductor substrate 102, and comprises two semiconducting fins 104 arranged in parallel (i.e., along the y-axis) and extending vertically (i.e., along the z-axis) from a surface 106 of the semiconductor substrate 102. For the embodiments of the FinFET 100, the semiconducting fins 104 are isolated from one-another by an isolation layer 108 formed over the semiconductor substrate 102. The semiconducting fins 104 comprise source and drain regions 110, 112, which are separated from one another by a channel region 114. A gate 118 overlays the channel region 114 of each semiconducting fin 104.

The FinFET 100 includes an epitaxial material 120 formed over the source and drain regions 110, 112 of each semiconducting fin 104. The epitaxial material 120 comprises a diamond-shape along cross-section AA' of the FinFET 100 width (i.e., the face of the FinFET 100 along the xz-plane). A wrap-around contact 122 is formed to each source and drain region 110, 112, and surrounds the epitaxial material 120 formed over each source or drain region 110, 112 on top and bottom surfaces 124, 126 of the diamond-shaped cross-section. A connecting structure 134 (e.g., contact, via, local interconnect, etc.) can then be used to couple the source or drain region 110, 112 to an external voltage source.

Figure 1B:
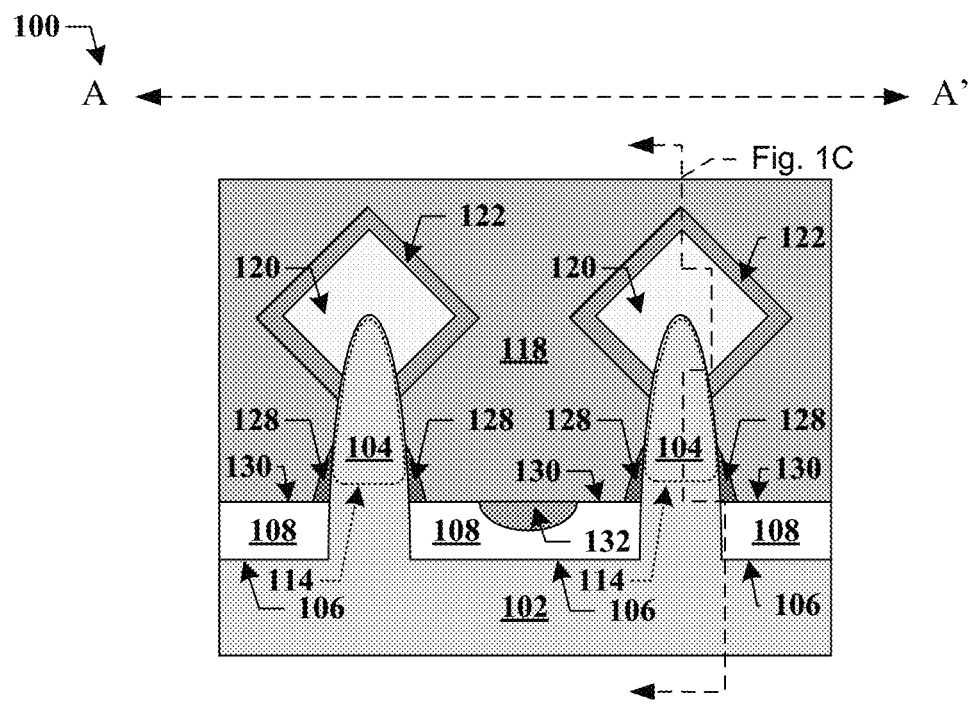

FIG. 1B illustrates a view of the FinFET 100 along cross-section AA', which shows the diamond-shaped cross-section of the epitaxial material 120. FIG. 1B includes several features that result from the method of formation of the wrap-around contact 122. Capping material 128 resides near a bottom portion of the sidewalls of each semiconducting fin 104 at an interface to an upper surface 130 of the isolation layer 108. Contact residue 132 (i.e., material of the wrap-around contact 122) resides on the upper surface 130 of the isolation layer 108 between the fins 104.

Figure 1C:
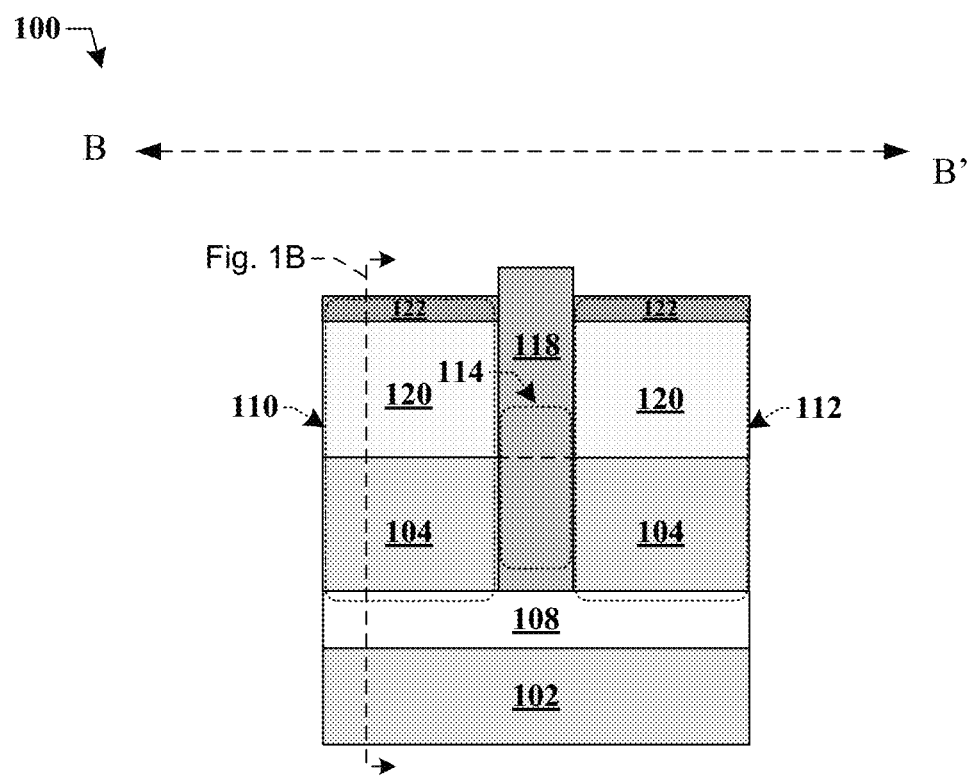

FIG. 1C illustrates a view of the FinFET 100 along cross-section BB' of the FinFET 100 length (i.e., bisecting a fin 104 of FinFET 100 along the yz-plane of FIG. 1A). The source, drain, and channel regions 110, 112, 114 are also illustrated. In some embodiments, the epitaxial material 120 formed on each fin 104 is configured to exert strain on the channel region 114 due to a lattice constant mismatch between the epitaxial material 120 and the fin 104. This strain increases carrier mobility within the channel region 114.

Figure 2:
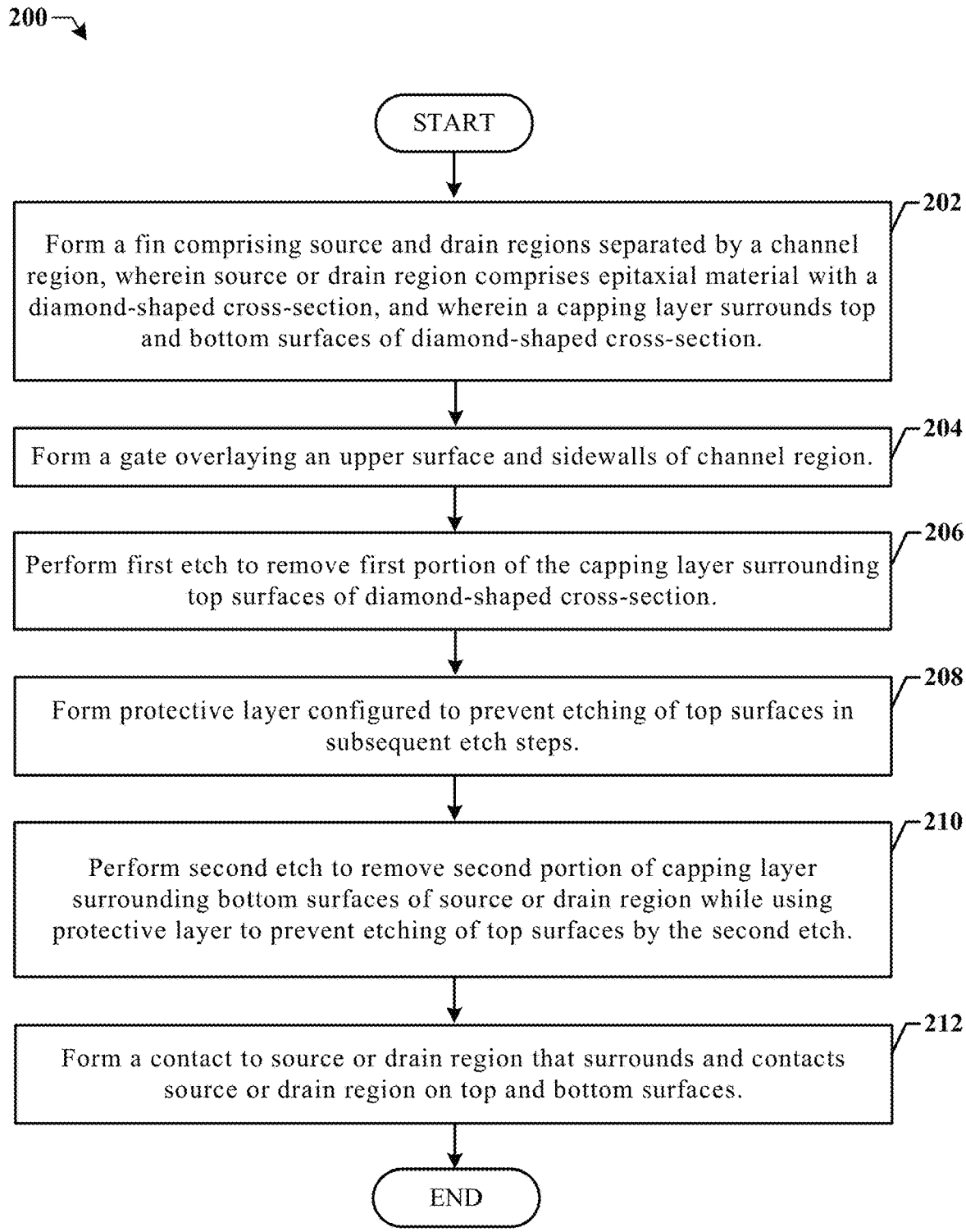
FIG. 2 illustrates some embodiments of a method to form a wrap-around contact to a source or drain region of a FinFET.

FIG. 2 illustrates some embodiments of a method 200 to form a wrap-around contact to a source or drain region of a FinFET.

At 202 a semiconducting fin is formed that extends vertically from a surface of a substrate. The semiconducting fin comprises source and drain regions which are separated from one another by a channel region. An epitaxial material is formed over the source or drain regions, and includes a diamond-shaped cross-section. A capping layer is formed that surrounds the diamond-shaped cross-section on its top and bottom surfaces. The capping layer is configured to protect the epitaxial material from various layer deposition and removal steps the FinFET.

At 204 a gate is formed that overlays an upper surface and sidewalls of the channel region of the semiconducting fin. In some embodiments, the gate comprises polysilicon. In some embodiments, the gate comprises a replacement metal gate (RMG). It will be appreciated that in some embodiments the source or drain regions formed in 202 can be formed after the gate is formed (e.g., a self-aligned process).

At 206 a first etch is performed to remove a first portion of the capping layer surrounding the top surfaces of the diamond-shaped cross-section of the epitaxial material. In some embodiments, the first etch utilizes a dry etch, wet etch, or combination thereof.

At 208 a protective layer is formed within the top surfaces of the diamond-shaped cross-section. The protective layer is configured to prevent etching of the top surfaces in subsequent etch steps intended to remove the capping layer from the bottom surfaces of the diamond-shaped cross-section.

At 210 a second etch is performed to remove a second portion of the capping layer surrounding the bottom surfaces of the diamond-shaped cross-section, while using the protective layer to prevent etching of the top surfaces of the diamond-shaped cross-section by the second etch.

At 212 a wrap-around contact is formed to the source or drain region. The wrap-around contact surrounds the source or drain region on the top and bottom surfaces of the diamond-shaped cross-section, and contacts the epitaxial material on the top and bottom surfaces. By contacting the epitaxial material on the top and bottom surfaces, the wrap-around contact has less contact resistance than if it were formed on the top surfaces only, or if the capping layer was not fully-removed from the bottom surfaces by the second etch, thus preventing the wrap-around contact from contacting the bottom surfaces.

FIGS. 3A-3B, 4A-4B, 5A-5B, 6A-6B, 7A-7B, and 8A-8B illustrate a series of cross-sectional views that collectively depict some embodiments of forming a wrap-around source or drain contact to a source or drain region of a FinFET.

Figure 3A:
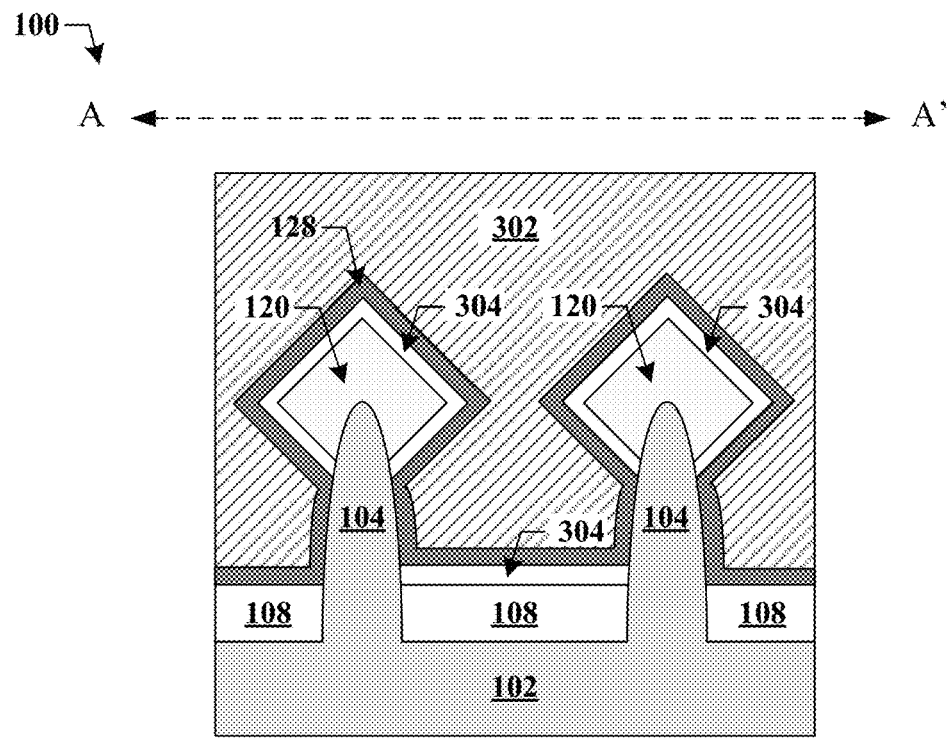
FIGS. 3A-3B, 4A-4B, 5A-5B, 6A-6B, 7A-7B, and 8A-8B illustrate a series of cross-sectional views that collectively depict some embodiments of forming a wrap-around contact to a source or drain region of a FinFET.

FIG. 3A illustrates the FinFET 100 along cross-section AA' prior to wrap-around contact formation. An oxide material 304 is disposed over the epitaxial material 120 on each semiconducting fin 104. The oxide material 304 is also formed on an upper surface of the isolation layer 108 between a pair of semiconducting fins 104. The capping material 128 is disposed over the oxide material 304. A dielectric material 302 is then formed over the substrate 102 and around the pair of semiconducting fins 104. In some embodiments, the capping material comprises silicon nitride (SiN).

Figure 3B:
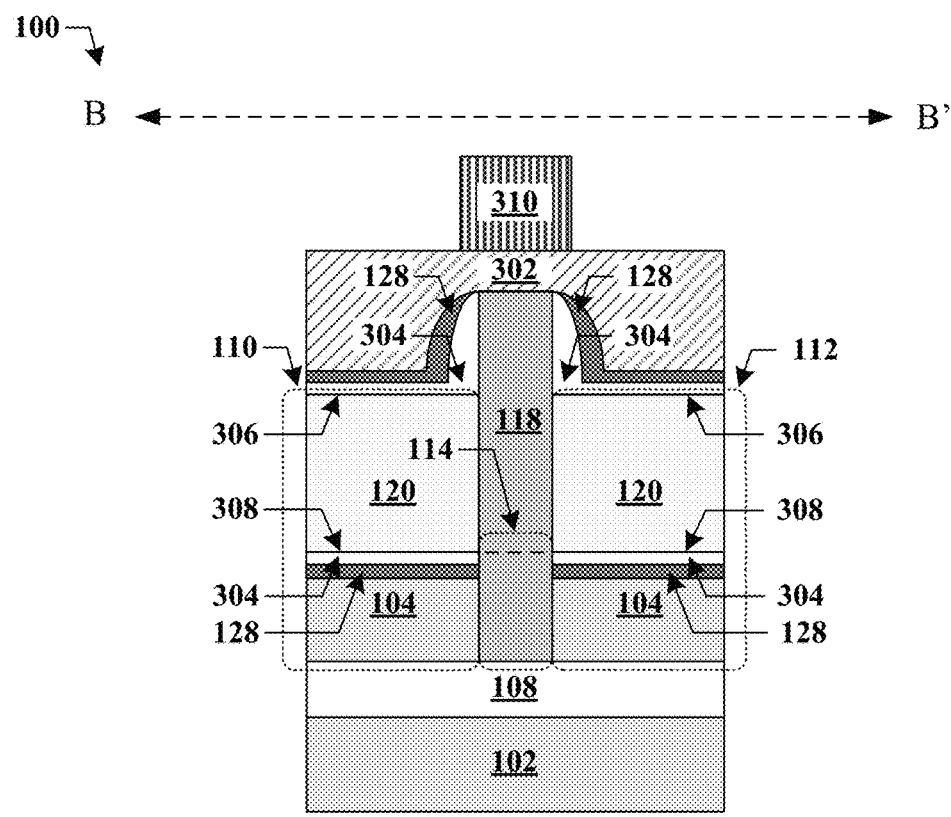

FIG. 3B illustrates the FinFET 100 along cross-section BB' (i.e., bisecting a fin 104 of FinFET 100 along the yz-plane of FIG. 1A) prior to wrap-around contact formation. The oxide material 304 and capping material 128 are formed on both the top and bottom surfaces 306, 308 of the epitaxial material 120. A mask layer 310 forms a pattern for a subsequent etch of the dielectric material 302. In some embodiments, the mask layer 310 comprises photoresist. In some embodiments, the epitaxial material 120 comprises germanium (Ge) or silicon-germanium (SiGe) configured to exert strain on the channel region 114 due to a lattice constant mismatch between the epitaxial material 120 and the semiconducting fin 104 comprising silicon (Si).

Figure 4A:
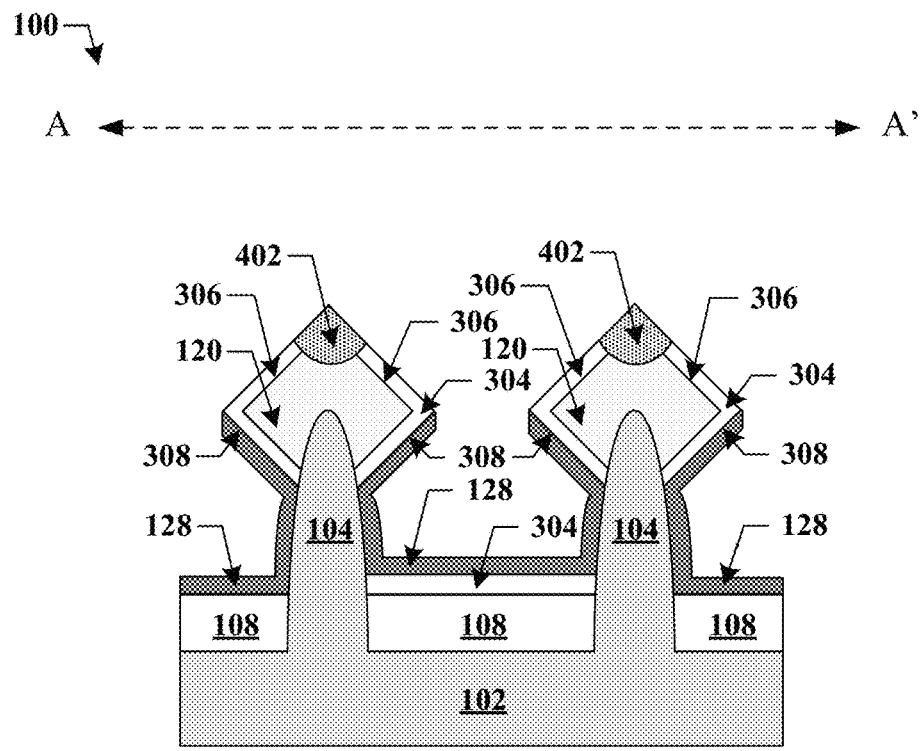
Figure 4B:
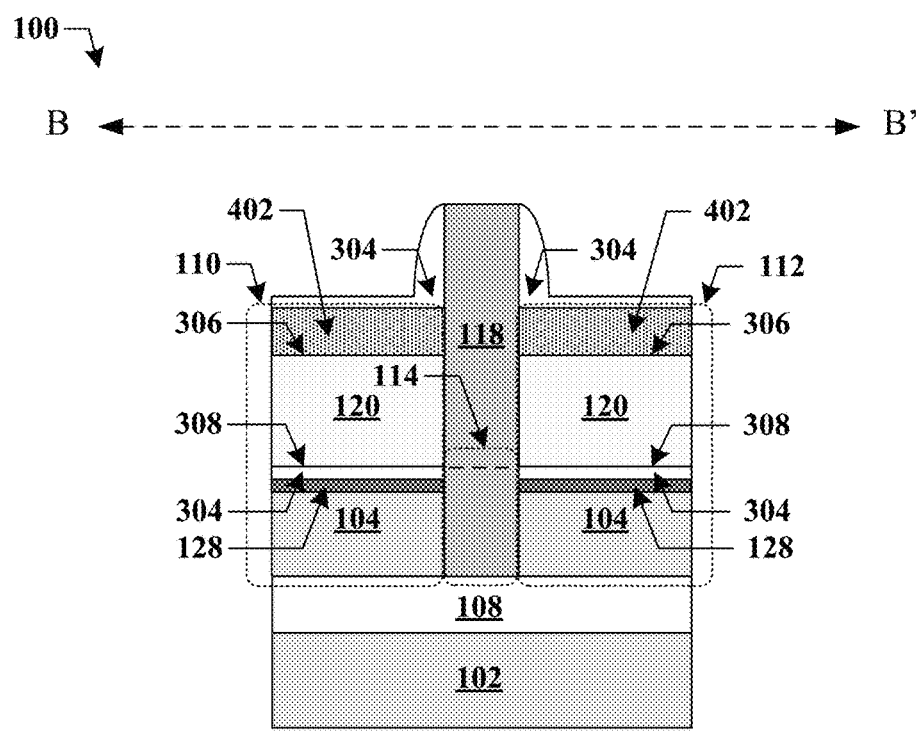

FIGS. 4A-4B illustrate the FinFET 100 along cross-sections AA' and BB' after removal of the dielectric material 302, and a first etch to remove capping material 128 from the top surface 306 of the epitaxial material 120. Removal of the dielectric material 302 exposes the capping material 128 on the top and bottom surfaces 306, 308 of the epitaxial material 120. In some embodiments, removal of the dielectric material 302 is achieved by an etch. For the embodiments of FIGS. 4A-4B, the first etch includes a plasma etch with comprisehexafluoro-1,3-butadiene ($C_4F_6$) etch and argon (Ar). The plasma etch also results in damage 402 to the epitaxial material 120 near the top surface 306. After removal of the dielectric material 302, the first etch is performed to remove the capping material 128 from the top surfaces 306 of the epitaxial material 120 to expose the oxide material 304 on the top surfaces 306 of the epitaxial material 120. In some embodiments, the first etch comprises a dry etch with fluoride ($CH_3F$) and hydrogen ($H_2$).

Some conventional approaches of dielectric material 302 removal utilize an $O_2$ ash plasma to remove a mask layer 310 of photoresist after the first etch. The $O_2$ ash plasma treatment can cause oxidation of the epitaxial material 120, which decreases etch selectivity between the epitaxial material 120 and capping material 128. To combat the effects of oxidation of the epitaxial material 120, the photoresist removal of the embodiments of FIGS. 4A-4B uses a diazene ($N_2H_2$) ash process.

Figure 5A:
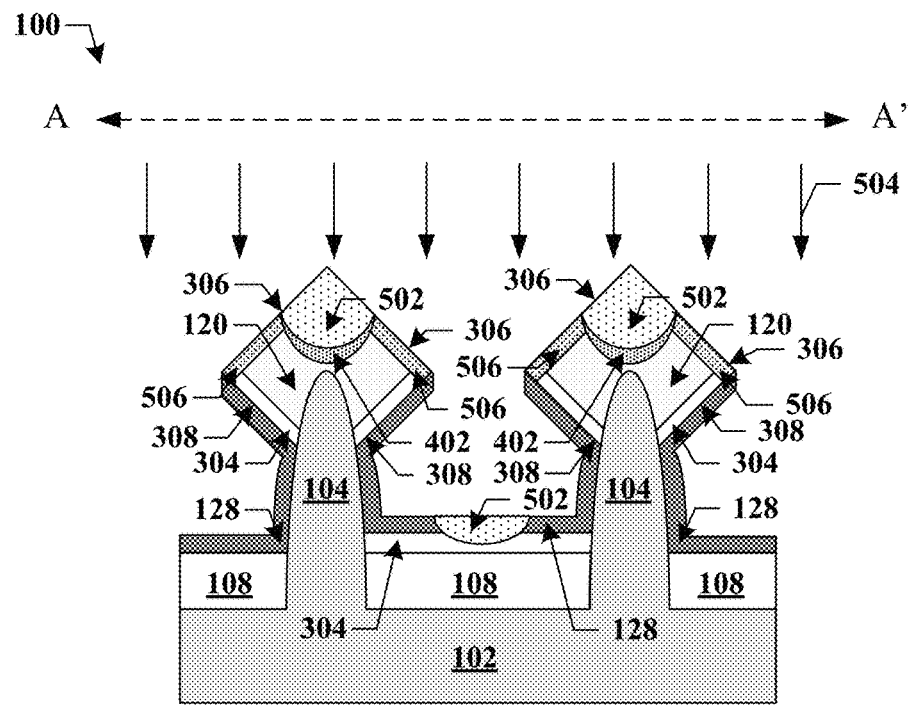
Figure 5B:
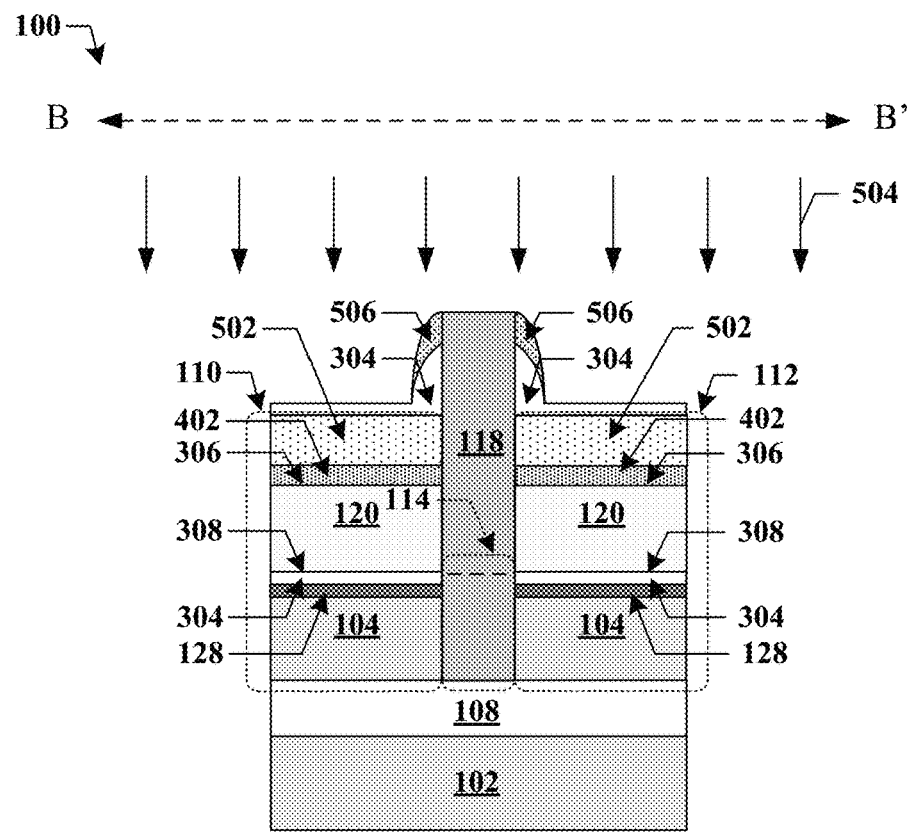

FIGS. 5A-5B illustrate the FinFET 100 along cross-sections AA' and BB' after formation of a protective material 502 within the top surfaces 306 of the epitaxial material 120. The protective material 502 is configured to prevent etching of the top surfaces 306 in subsequent etch steps to prevent loss of the epitaxial material 120. The protective material 502 is also formed between the pair of fins 104 over a surface of the isolation layer 108. The protective material 502 is configured to provide for better etch selectivity between itself and the remaining capping material 128 than between the epitaxial material 120 and the capping material 128. This increased selectivity helps prevent loss of the protective material 502 in a subsequent etch step to remove the capping material 128 from the bottom surfaces 308 of the epitaxial material 120.

In some embodiments, formation of the protective material 502 comprises performing a carbon (C) implant 504 of the top surfaces 306. In some embodiments, the carbon implant is performed with little to no implant angle or rotation (i.e., 0° tilt and 0° rotation). In some embodiments, the carbon implant is performed at a relatively low energy (e.g., between about 0.5 keV and about 10 keV). In some embodiments, the carbon implant is performed with a dosage in a range of about 1e13 $cm^{-2}$ to about 1e16 $cm^{-2}$. In some embodiments, the carbon implant is performed with a depth range of about 1 nm to about 100 nm. In some embodiments, the carbon implant is performed with a peak carbon concentration of about 0.1% to about 5%. In some embodiments, the protective layer comprises silicon-carbon-phosphorus (SiCP), silicon-carbon-germanium (SiGeC), or germanium-carbon (GeC).

The C implant 504 also interacts with the oxide material 304 on the top surfaces 306 of the epitaxial material 120 and on sides of the gate 118 to form an implanted oxide 506.

Figure 6A:
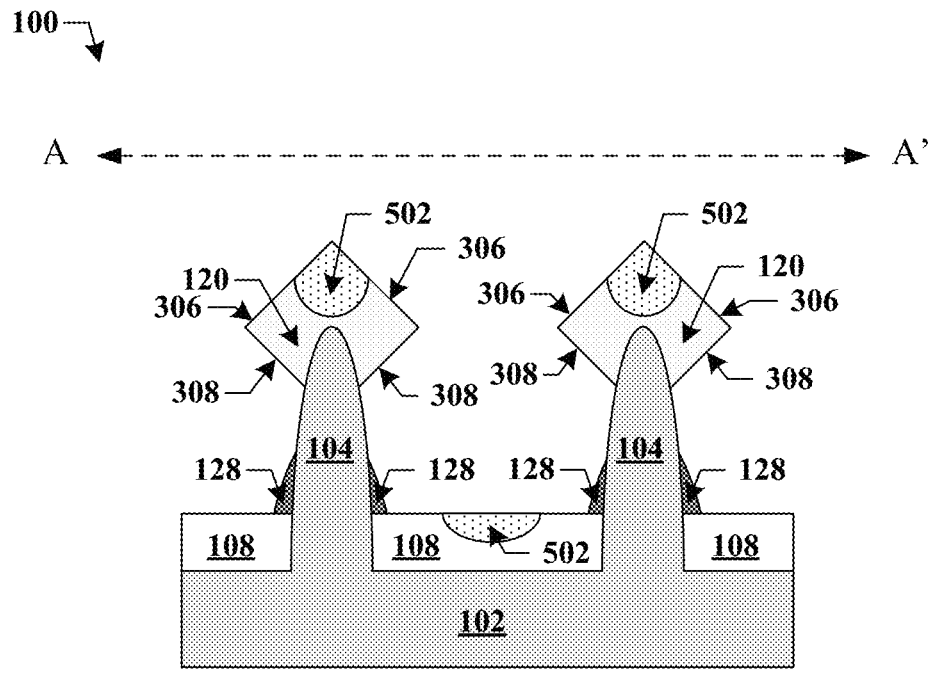
Figure 6B:
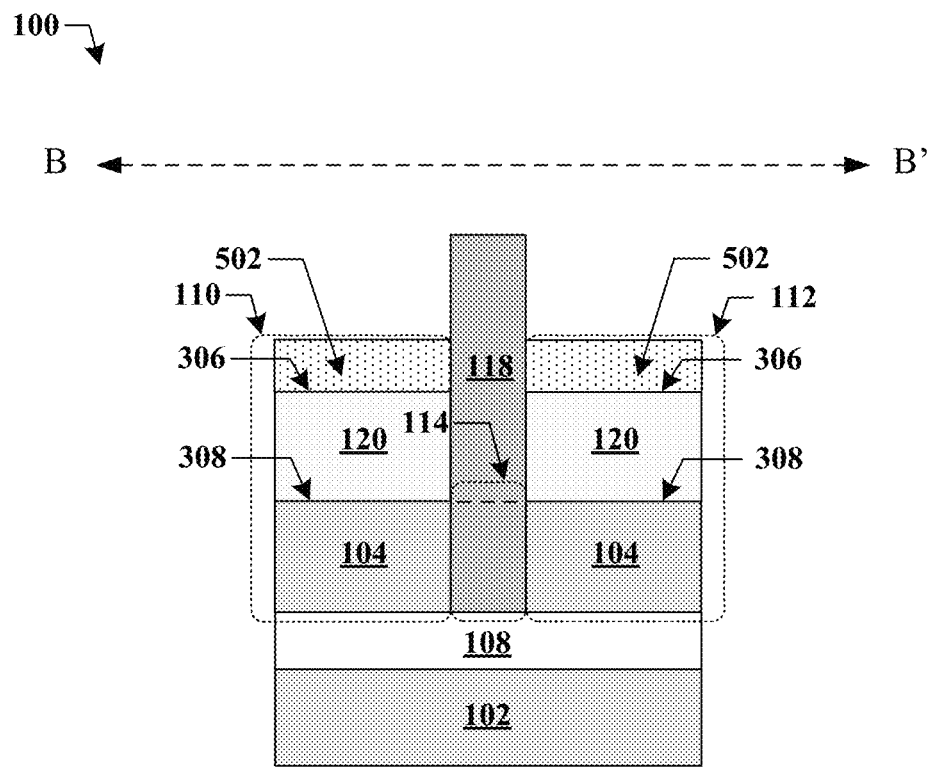

FIGS. 6A-6B illustrate the FinFET 100 along cross-sections AA' and BB', wherein the oxide material 304 (or implanted oxide 506 byproduct of the C implant 504 of FIGS. 5A-5B) has been removed from the top surfaces 306 of the epitaxial material 120. A second etch is then performed to remove the capping material 128 from the bottom surfaces 308 of the epitaxial material 120. The second etch utilizes an etchant with a selectivity between the protective material 502 and capping material 128 such that the capping material 128 is etched at a higher rate than the protective material 502. As a result, the epitaxial material 120 is left substantially intact.

The protective material 502 therefore protects the epitaxial material 120 from the second etch. As a result, the capping material 128 is removed from the bottom surfaces 308, while leaving the diamond-shaped epitaxial material 120 substantially intact. After the second etch, the remaining oxide material 304 has been removed from the bottom surfaces 308 to expose the epitaxial material 120 on the bottom surfaces 308. While some of the capping material 128 remains at the base of one or more fins 104, the capping material 128 is removed from the top and bottom surfaces 306, 308 of the epitaxial material 120 to allow for increased contact area to the epitaxial material 120.

In some embodiments, the oxide material 304 (or implanted oxide 506) is removed with dilute hydrofluoric acid (DHF). In some embodiments, the second etch comprises a wet etch phosphoric acid ($H_3PO_4$).

Figure 7A:
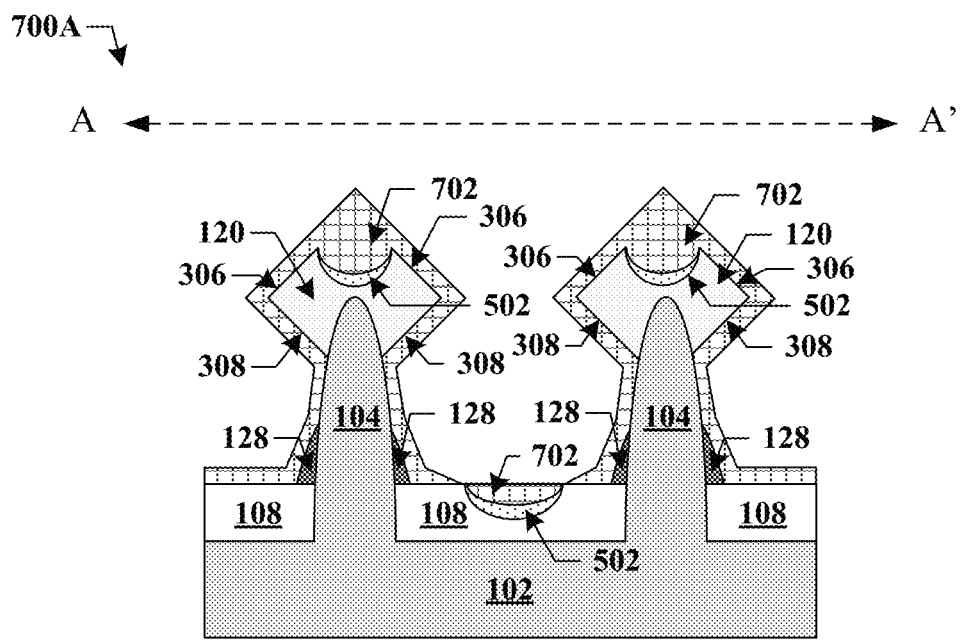
Figure 7B:
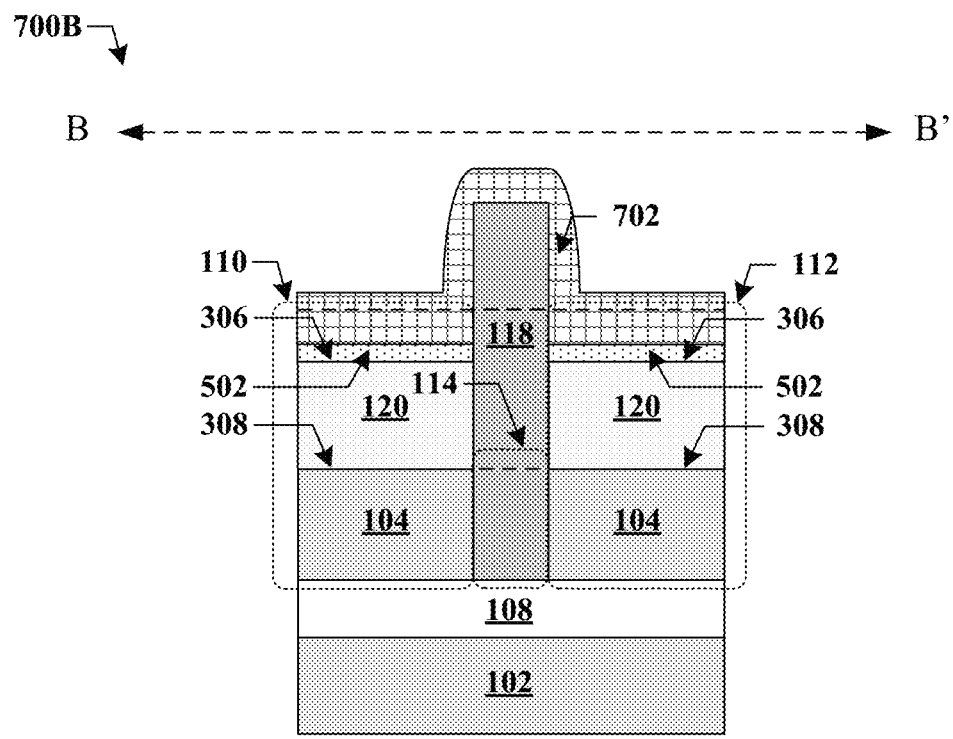

FIGS. 7A-7B illustrate the FinFET 100 along cross-sections AA' and BB', wherein a conducting material 702 has been deposited over the surface of the substrate 102, including the epitaxial material 120 and fins 104. The conducting material 702 surrounds the diamond-shaped cross-section of epitaxial material 120 on its top and bottom surfaces 306, 308. In some embodiments, the conducting material 702 comprises nickel (Ni).

Figure 8A:
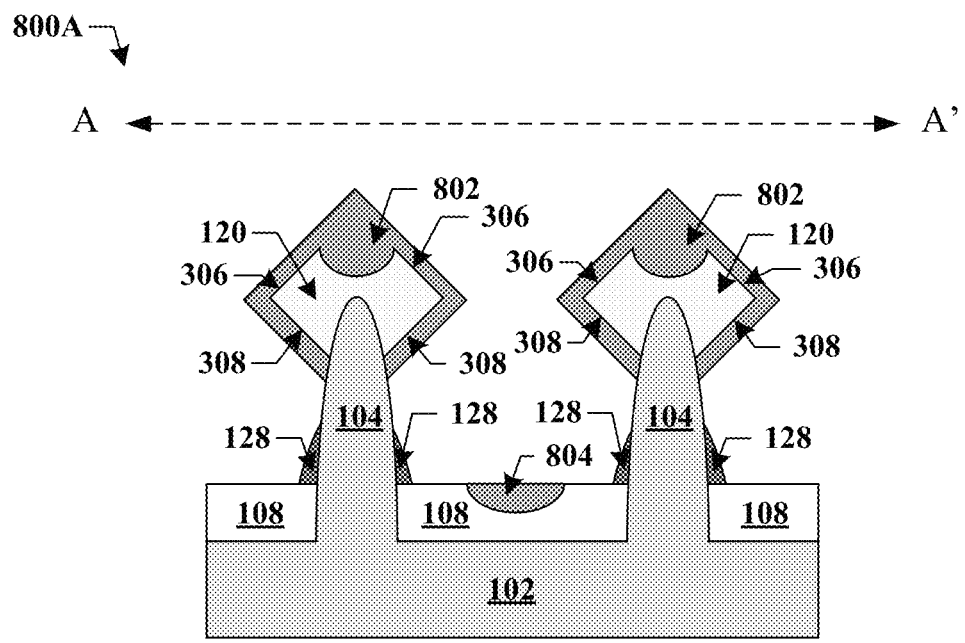
Figure 8B:
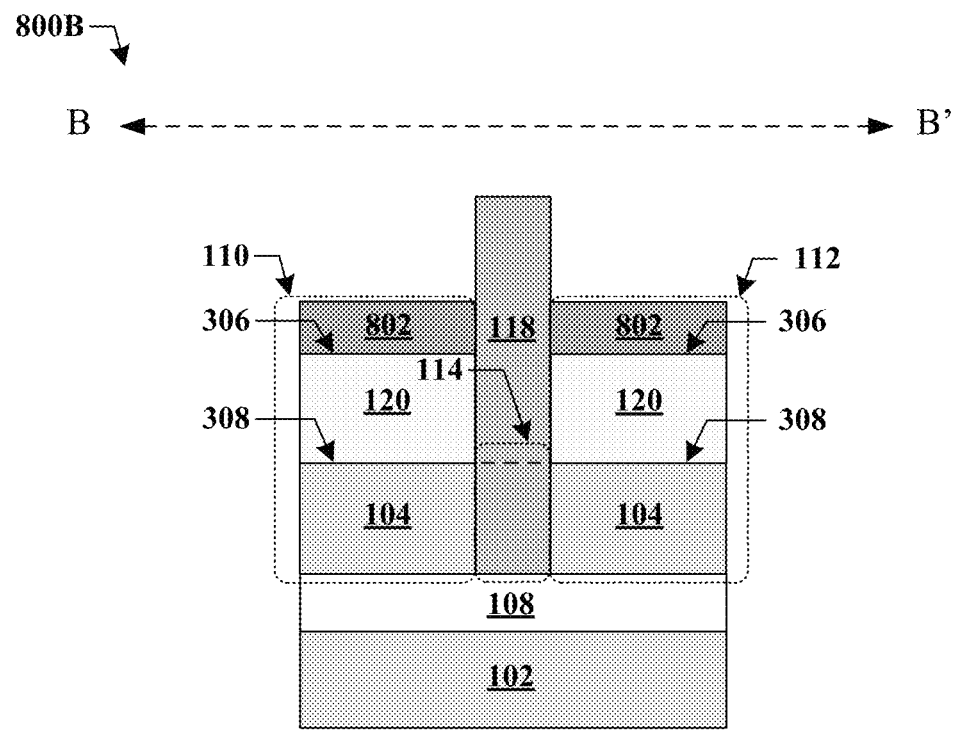

FIGS. 8A-8B illustrate the FinFET 100 along cross-sections AA' and BB', wherein a conducting material 702 has been annealed, resulting in a reaction between the conducting material 702 and epitaxial material 120. Non-reacting conducting material 702 (i.e., not touching the epitaxial material 120) has been subsequently removed. The remaining reacting material forms wrap-around contacts 802.

In some embodiments, the conducting material 702 comprises Ni and the epitaxial material comprises germanium (Ge) or silicon-germanium (SiGe). The reaction caused by the anneal results in wrap-around contacts 802 comprising nickel-germanium (NiGe) or nickel-silicon-germanium (NiSiGe), respectively.

Figure 9:
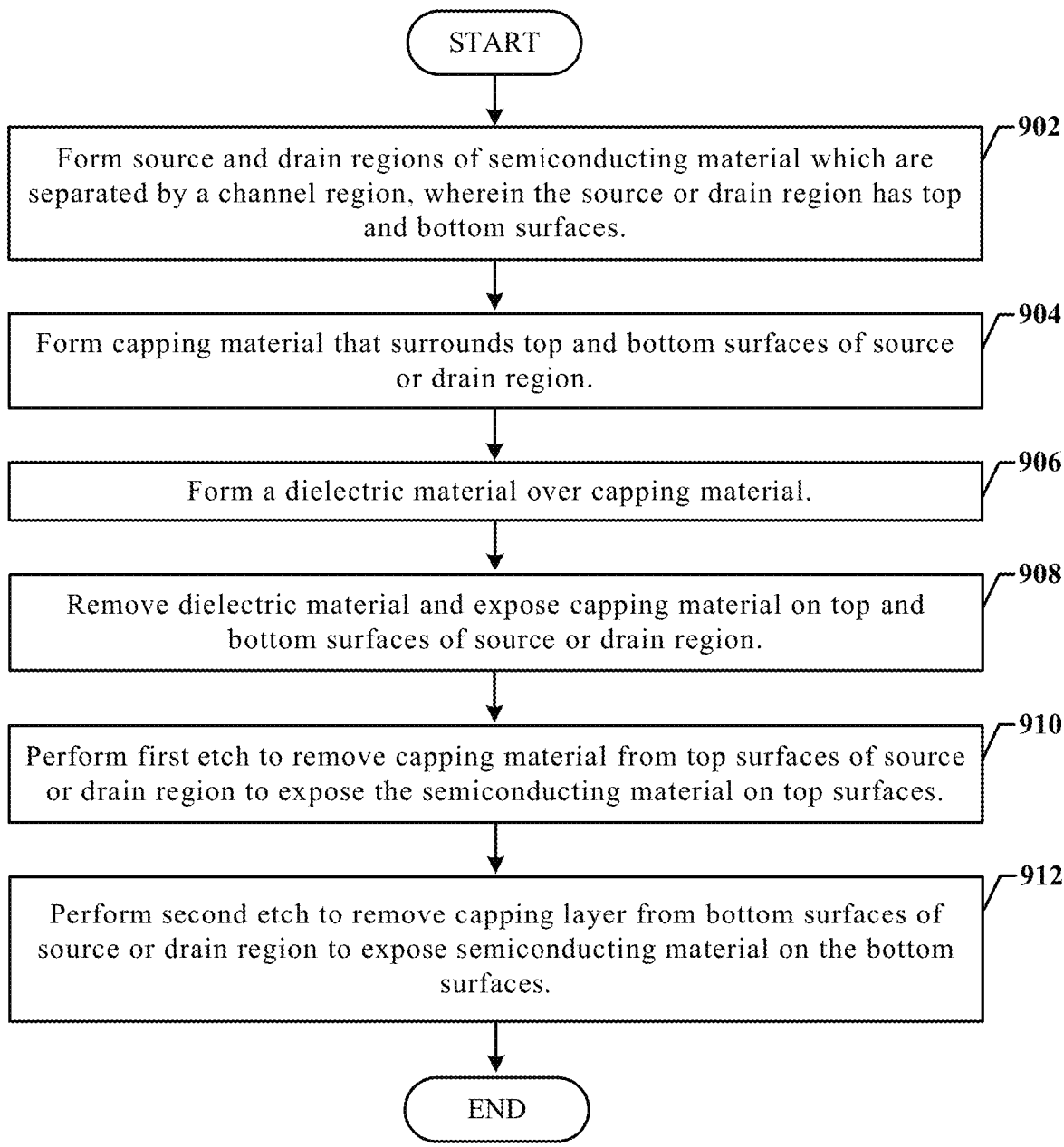
FIG. 9 illustrate some embodiments of a method of capping layer removal for wrap-around contact formation to a source or drain region of a FinFET.

FIG. 9 illustrates some embodiments of a method of capping layer removal for wrap-around contact formation to a source or drain region of a FinFET.

At 902 source and drain regions of semiconducting material are formed. The source and drain regions are separated from one another by a channel region, and have top and bottom surfaces. In some embodiments, the source and drain regions comprise a plurality of semiconducting fins (e.g., Si fins formed by recessing a Si substrate). In some embodiments, the semiconducting fins are covered with an epitaxial material (e.g., Ge, SiGe, etc.) configured to impart strain of the channel region due to a lattice mismatch between the epitaxial material and substrate material. In some embodiments, the epitaxial material has the top and bottom surfaces.

At 904 a capping material (e.g., SiN) is formed that surrounds the top and bottom surfaces of the source and drain regions. The capping material comprises an etch stop layer configured to prevent etching of the source and drain regions while manufacturing the FinFET.

At 906 a dielectric material is formed over the capping material and is configured to electrically isolate the FinFET from other devices on the substrate.

At 908 the dielectric material is removed to expose the capping material on the top and bottom surfaces of the source and drain regions. In some embodiments, removing the dielectric material comprises a comprisehexafluoro-1,3-butadiene ($C_4F_6$) plasma etch, an argon (Ar) plasma etch, or a combination thereof.

At 910 a first etch is performed. The first etch is configured to remove the capping material from the top surfaces of the source or drain region to expose the semiconducting material on the top surfaces. In some embodiments, the first etch comprises a dry etch with fluoride ($CH_3F$), hydrogen ($H_2$), or a combination thereof.

At 912 a second etch configured to remove the capping layer from the bottom surfaces of the source or drain region to expose the semiconducting material on the bottom surfaces. The second etch utilizes an etchant with a selectivity between the semiconducting material and capping material such that the capping material is etched at a higher rate than the semiconducting material. In some embodiments, the second etch comprises a wet etch phosphoric acid ($H_3PO_4$), dilute hydrofluoric acid (DHF), or a combination thereof.

Therefore, some embodiments of the present disclosure relate to a wrap-around contact formed to a source or drain region of a "finned" field-effect transistor (FinFET). An epitaxial material is formed over the source or drain region, which includes a diamond-shaped cross-section with top and bottom surfaces. A capping layer is formed over the top and bottom surfaces. The source or drain region is then subjected to a first etch to remove the capping layer surrounding the top surfaces of the diamond-shaped cross-section. A protective layer is formed within the top surfaces. A second etch of the capping layer is performed to remove the capping layer surrounding the bottom surfaces of the diamond-shaped cross-section, while using the protective layer to prevent etching of the top surfaces by the second etch. A wrap-around contact is formed to the source or drain region, which surrounds the source or drain region on the top and bottom surfaces of the diamond-shaped cross-section.

In some embodiments, the present disclosure relates to a semiconductor device, comprising a semiconducting fin extending vertically from a surface of the substrate and comprising source and drain regions, which are separated from one another by a channel region. A gate overlays an upper surface and sidewalls of the channel region. And, a contact is formed to the source or drain region of the semiconducting fin, wherein the source or drain region comprises a layer of epitaxial material with a diamond-shaped cross-section, and wherein the contact surrounds the source or drain region on top and bottom surfaces of the diamond-shaped cross-section.

In some embodiments, the present disclosure relates to a method for forming a semiconductor device. The method comprises forming a fin that extends vertically from a surface of a substrate and comprises source and drain regions which are separated from one another by a channel region, wherein the source or drain region comprises epitaxial material with a diamond-shaped cross-section, and wherein a capping layer surrounds the diamond-shaped cross-section on its top and bottom surfaces. The method further comprises forming a gate overlaying an upper surface and sidewalls of the channel region. The method further comprises performing a first etch to remove a first portion of the capping layer surrounding the top surfaces of the diamond-shaped cross-section. The method further comprises forming a protective layer within the top surfaces of the diamond-shaped cross-section, wherein the protective layer is configured to prevent etching of the top surfaces in subsequent etch steps.

In some embodiments, the present disclosure relates to a method, comprising forming source and drain regions of semiconducting material which are separated from one another by a channel region, wherein the source or drain region has top and bottom surfaces. The method further comprises forming a capping material that surrounds the top and bottom surfaces of the source or drain region, and forming a dielectric material over the capping material. The method further comprises removing the dielectric material and expose the capping material on the top and bottom surfaces of the source or drain region. The method further comprises performing a first etch configured to remove the capping material from the top surfaces of the source or drain region to expose the semiconducting material on the top surfaces. The method further comprises performing a second etch configured to remove the capping layer from the bottom surfaces of the source or drain region to expose the semiconducting material on the bottom surfaces. The second etch utilizes an etchant with a selectivity between the semiconducting material and capping material such that the capping material is etched at a higher rate than the semiconducting material.

While methods 200 and 900 have been described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first semiconductor fin extending from a substrate and through an isolation layer, the first semiconductor fin comprising a source region and a drain region;
   a gate overlying the first semiconductor fin between the source region and the drain region;
   a contact coupled to the source region or the drain region; and
   a capping material disposed along a first sidewall of the first semiconductor fin, wherein the capping material is spaced from the contact, and wherein the contact contacts the first sidewall.

2. The semiconductor device of claim 1, wherein the isolation layer contacts the substrate.

3. The semiconductor device of claim 1, wherein the capping material contacts the isolation layer.

4. The semiconductor device of claim 1, wherein a distance between opposite outermost sidewalls of the contact is greater than a distance between opposite outermost sidewalls of the first semiconductor fin.

5. The semiconductor device of claim 1, further comprising:
   a second semiconductor fin extending from the substrate and through the isolation layer, wherein the first sidewall faces the second semiconductor fin.

6. The semiconductor device of claim 5, further comprising:

contact residue disposed over the substrate and between the first semiconductor fin and the second semiconductor fin.

7. The semiconductor device of claim 1, wherein the contact extends laterally away from the first sidewall and continuously over the first semiconductor fin to contact a second sidewall of the first semiconductor fin that is opposite the first sidewall.

8. The semiconductor device of claim 1, further comprising:
an epitaxial structure disposed on the first semiconductor fin, wherein a distance between opposite outermost sidewalls of the epitaxial structure is greater than a distance between opposite outermost sidewalls of the first semiconductor fin.

9. The semiconductor device of claim 8, wherein the contact extends from the first sidewall and wraps around a perimeter of the epitaxial structure to contact a second sidewall of the first semiconductor fin that is opposite the first sidewall.

10. The semiconductor device of claim 9, wherein the epitaxial structure has a substantially diamond-shaped cross-section.

11. A semiconductor device, comprising:
a first semiconductor fin extending from a substrate, wherein the first semiconductor fin comprises a source region and a drain region;
a second semiconductor fin extending from the substrate and laterally spaced from the first semiconductor fin;
a gate overlying the first semiconductor fin and the second semiconductor fin;
a contact coupled to the source region or the drain region; and
contact residue disposed over the substrate and between the first semiconductor fin and the second semiconductor fin, wherein the contact residue is spaced from the first semiconductor fin, and wherein the contact residue is spaced from the contact.

12. The semiconductor device of claim 11, wherein the contact residue is spaced from the second semiconductor fin.

13. The semiconductor device of claim 11, wherein an uppermost surface of the contact residue is disposed below a bottommost surface of the contact.

14. The semiconductor device of claim 11, wherein both the contact and the contact residue comprise a same material.

15. The semiconductor device of claim 11, further comprising:
an epitaxial structure disposed on the first semiconductor fin, wherein a distance between opposite outermost sidewalls of the epitaxial structure is greater than a distance between opposite outermost sidewalls of the first semiconductor fin, and wherein the contact wraps around the epitaxial structure from a first side of the first semiconductor fin to a second side of the first semiconductor fin opposite the first side.

16. A semiconductor device, comprising:
a first semiconductor fin extending from a substrate and through an isolation layer, wherein the first semiconductor fin comprises a source region and a drain region;
a second semiconductor fin laterally spaced from the first semiconductor fin and extending from the substrate through the isolation layer;
a gate overlying the first semiconductor fin between the source region and the drain region;
a contact coupled to the source region or the drain region; and
a capping material disposed along a sidewall of the first semiconductor fin that faces the second semiconductor fin, wherein the capping material is spaced from the second semiconductor fin, wherein a lower surface of the capping material is disposed over an upper surface of the isolation layer, and wherein the capping material is spaced from the contact.

17. The semiconductor device of claim 16, further comprising:
an epitaxial structure disposed on the first semiconductor fin, wherein the epitaxial structure has a substantially diamond-shaped cross-section, and wherein the contact wraps around the epitaxial structure along outer sidewalls of the epitaxial structure from a first side of the first semiconductor fin to a second side of the first semiconductor fin opposite the first side.

18. The semiconductor device of claim 16, further comprising:
contact residue disposed over the substrate and between the first semiconductor fin and the second semiconductor fin, wherein both the contact and the contact residue comprise a same material.

19. The semiconductor device of claim 18, wherein the capping material is spaced from the contact residue.

20. The semiconductor device of claim 16, wherein the capping material contacts the sidewall of the first semiconductor fin.

* * * * *